(12) United States Patent
Brody (10) Patent No.: US 7,657,999 B2
(45) Date of Patent: Feb. 9, 2010

(54) METHOD OF FORMING AN ELECTRICAL CIRCUIT WITH OVERLAYING INTEGRATION LAYER

(75) Inventor: Thomas Peter Brody, Pittsburgh, PA (US)

(73) Assignee: Advantech Global, Ltd, Tortola (VG)

( * ) Notice: Subject to any disclaimer, the term of this patent is extended or adjusted under 35 U.S.C. 154(b) by 296 days.

(21) Appl. No.: 11/868,640

(22) Filed: Oct. 8, 2007

(65) Prior Publication Data

US 2009/0089997 A1 Apr. 9, 2009

(51) Int. Cl.
*H05K 3/10* (2006.01)

(52) U.S. Cl. ............................. 29/846; 29/825; 29/830; 29/831; 29/832; 29/840; 438/598; 438/599; 438/622

(58) Field of Classification Search ......... 438/598–599, 438/622; 29/825, 830, 832, 840, 846
See application file for complete search history.

(56) References Cited

U.S. PATENT DOCUMENTS

| | | | |
|---|---|---|---|
| 6,091,191 A * | 7/2000 | Togawa ...................... 313/402 |
| 7,211,856 B2 * | 5/2007 | Sezi et al ..................... 257/310 |
| 7,238,964 B2 * | 7/2007 | Walter et al. .................. 257/59 |
| 7,287,469 B2 * | 10/2007 | Birnstock et al. ........... 101/129 |
| 2004/0023434 A1 * | 2/2004 | Venkatesan et al. ......... 438/106 |
| 2004/0252298 A1 * | 12/2004 | Luey et al. ............... 356/243.1 |
| 2006/0237716 A1 * | 10/2006 | Sezi et al. ..................... 257/40 |
| 2007/0296047 A1 * | 12/2007 | Kretz et al. ................. 257/410 |
| 2008/0275273 A1 * | 11/2008 | Effenberger et al. .......... 568/14 |

\* cited by examiner

*Primary Examiner*—Derris H Banks
*Assistant Examiner*—Azm Parvez
(74) *Attorney, Agent, or Firm*—The Webb Law Firm (57) ABSTRACT

In a method of forming an electrical circuit assembly, a substrate is provided including a plurality of first segments that form an electrical circuit. The first segments have surfaces that rise above surfaces of other segments that form the electrical circuit. All of the segments are deposited on the substrate via one or more shadow mask vapor deposition processes in a vacuum. A photoresist caused to cover all of the segments is hardened and then abraded until surfaces of the first segments are exposed, but surfaces of the other segments are not exposed, and a surface of the abraded photoresist is at the same level as the exposed surfaces of the first segments. Second segments can be deposited on the exposed surfaces of the first segments via a shadow mask vapor deposition process in a vacuum to a level above the top surface of the abraded photoresist.

9 Claims, 5 Drawing Sheets

METHOD OF FORMING AN ELECTRICAL CIRCUIT WITH OVERLAYING INTEGRATION LAYER

BACKGROUND OF THE INVENTION

1. Field of the Invention

The present invention relates to a method of manufacturing a substrate including electronic elements of an electronic circuit in a manner whereupon the substrate can be incorporated into a higher level electronic device with little or no additional processing.

2. Description of Related Art

Electronic circuits with repetitive patterns, such as memories and imaging or display devices are, widely used in OLED industry. Presently, such circuits are formed by photolithographic processes.

A shadow mask deposition process is well-known and has been used for years in micro-electronics manufacturing. The shadow mask process is a significantly less costly and less complex manufacturing process compared to the photolithography process.

However, a substrate including electronic elements of an electronic circuit produced by the current shadow mask deposition process is typically not ready to be incorporated into a higher level electronic device without further processing. Accordingly, it would be desirable to augment the current shadow mask deposition process in order to produce a substrate having electronic elements of an electronic circuit produced by the shadow mask deposition process that is ready for incorporation into a higher level electronic assembly with little or no additional processing.

SUMMARY OF THE INVENTION

One embodiment of a method of forming an electrical circuit assembly on a substrate includes (a) depositing a first metal segment on a substrate via a shadow mask vapor deposition process; (b) depositing a photoresist on the substrate such that the photoresist covers the first metal segment and an area surrounding the first metal segment; (c) causing the photoresist deposited on the substrate to harden; and (d) abrading the hardened photoresist until a surface of the first metal segment is exposed and a surface of the hardened photoresist is at the same level as the exposed surface of the first metal segment.

Step (a) can be performed in a vacuum. Steps (b), (c) and (d) can be preformed at atmospheric pressure.

The method can further include (e) depositing a second metal segment on the exposed surface of the first metal segment via a shadow mask vapor deposition process.

Step (e) can also be performed in a vacuum.

Step (d) (abrading) can be accomplished by a dry or wet grinding process.

Another embodiment of a method of forming an electrical circuit assembly on a substrate includes (a) providing a substrate having thereon a plurality of first segments comprising an electrical circuit, said first segments having surfaces that rise above surfaces of other segments comprising the electrical circuit, wherein all of said segments are deposited on the substrate via one or more shadow mask vapor deposition processes in a vacuum; (b) causing a photoresist to cover all of the segments; (c) causing the photoresist deposited in step (b) to harden; and (d) abrading the hardened photoresist until surfaces of the first segments are exposed but surfaces of the other segments are not exposed, and a surface of the abraded photoresist is at the same level as the exposed surfaces of the first segments.

Steps (b), (c) and (d) can be preformed at atmospheric pressure.

The method can further include (e) depositing second segments on the exposed surfaces of the first segments via a shadow mask vapor deposition process in a vacuum, whereupon the top surfaces of the second segments rise above the top surface of the abraded photoresist.

Each segment can be either a conductor, an insulator or a semiconducting material.

DETAILED DESCRIPTION OF THE INVENTION

The present invention will be described with reference to the accompanying figures where like reference numbers correspond to like elements.

Figures 1A, 1B:
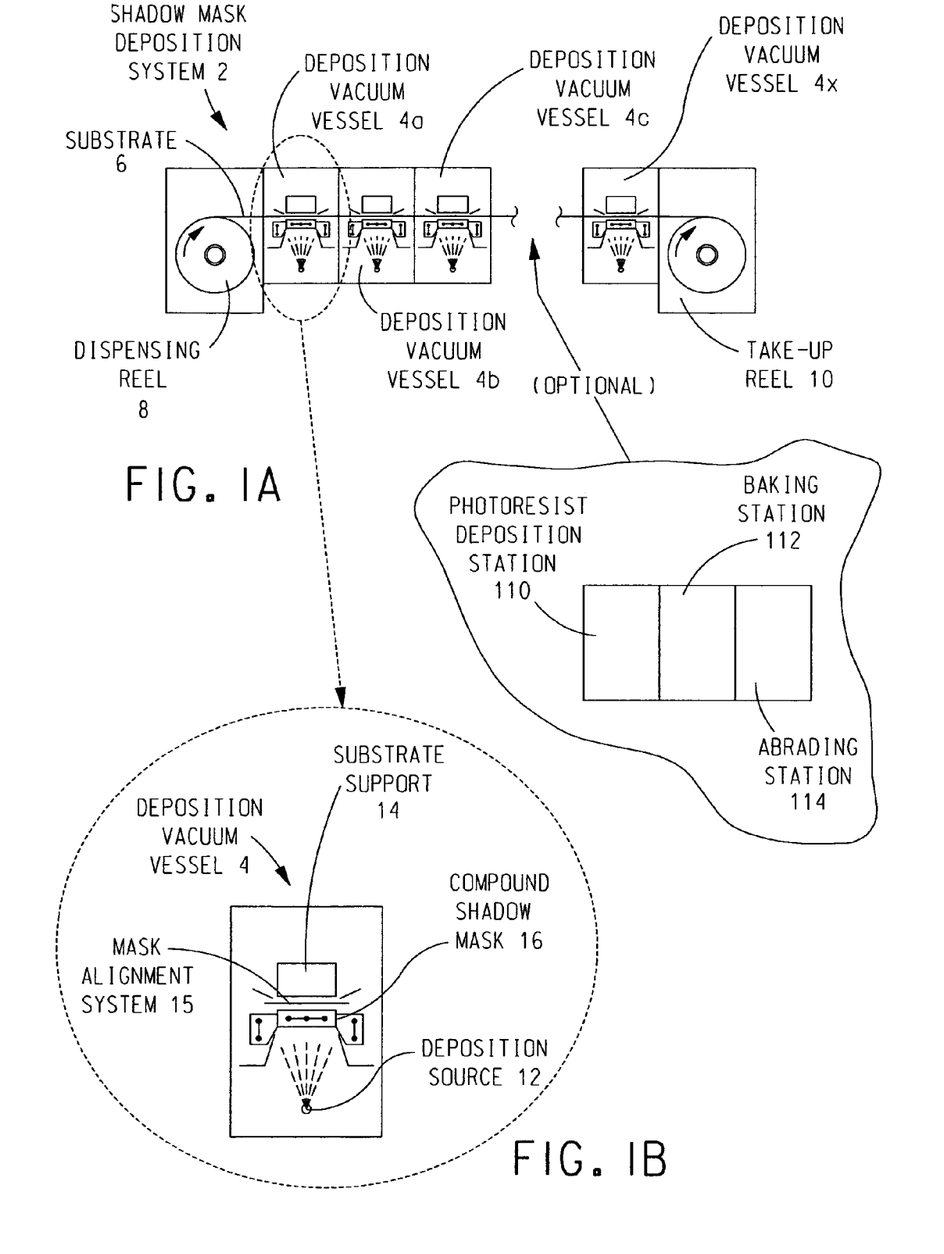
FIG. 1A is a diagrammatic illustration of a shadow mask deposition system for forming pixel structures of a high resolution active matrix backplane.
FIG. 1B is an enlarged view of a single deposition vacuum vessel of the shadow mask deposition system of FIG. 1A.

With reference to FIGS. 1A and 1B, a shadow mask deposition system 2 for forming an electronic device, such as, without limitation, a high resolution active matrix light emitting diode (LED) display, includes a plurality of serially arranged deposition vacuum vessels 4 (e.g., deposition vacuum vessels 4a-4x). The number and arrangement of deposition vacuum vessels 4 is dependent on the number of deposition events required for any given product to be formed therewith.

In use of shadow mask deposition system 2, a flexible substrate 6 translates through the serially arranged deposition vacuum vessels 4 by means of a reel-to-reel mechanism that includes a dispensing reel 8 and a take-up reel 10.

Each deposition vacuum vessel includes a deposition source 12, a substrate support 14, a mask alignment system 15 and a shadow mask 16. For example, deposition vacuum vessel 4a includes deposition source 12a, substrate support 14a, mask alignment system 15a and shadow mask 16a; deposition vacuum vessel 4b includes deposition source 12b, substrate support 14b, mask alignment system 15b and shadow mask 16b; and so forth for any number of deposition vacuum vessels 4.

Each deposition source 12 is charged with a desired material to be deposited onto substrate 6 through one or more openings in the corresponding shadow mask 16 which is held in intimate contact with the portion of substrate 6 in the corresponding deposition vacuum vessel 4 during a deposition event. Shadow mask 16 can be a conventional single layer shadow mask or a compound (multi-layer) shadow mask of the type disclosed in co-pending U.S. patent application Ser. No. 11/820,659, filed Jun. 20, 2007, and entitled "Electronic Circuit With Repetitive Patterns Formed By Shadow Mask Vapor Deposition And A Method Of Manufacturing An Electronic Circuit Element", which is incorporated herein by reference.

Each shadow mask 16 of shadow mask deposition system 2 includes one or more openings. The opening(s) in each shadow mask 16 corresponds to a desired pattern of material to be deposited on substrate 6 from a corresponding deposition source 12 in a corresponding deposition vacuum vessel 4 as substrate 6 translates through shadow mask deposition system 2.

Each shadow mask 16 can be formed of, for example, nickel, chromium, steel, copper, Kovar® or Invar®, and has a thickness desirably between 20 and 200 microns, and more desirably between 20 and 50 microns. Kovar® and Invar® can be obtained from, for example, ESPICorp Inc. of Ashland, Oreg. In the United States, Kovar® is a registered trademark, Registration No. 337,962, currently owned by CRS Holdings, Inc. of Wilmington, Del., and Invar® is a registered trademark, Registration No. 63,970, currently owned by Imphy S.A. Corporation of France.

Those skilled in the art will appreciate that shadow mask deposition system 2 may include additional stages (not shown), such as an anneal stage, a test stage, one or more cleaning stages, a cut and mount stage, and the like, as are well-known. In addition, the number, purpose and arrangement of deposition vacuum vessels 4 can be modified by one of ordinary skill in the art as needed for depositing one or more materials required for a particular application. An exemplary shadow mask deposition system and method of use thereof is disclosed in U.S. patent application Ser. No. 10/255,972, filed Sep. 26, 2002, and entitled "Active Matrix Backplane For Controlling Controlled Elements And Method Of Manufacture Thereof", which is incorporated herein by reference.

Deposition vacuum vessels 4 can be utilized for depositing materials on substrate 6 to form one or more electronic elements of the electronic device on substrate 6. Each electronic element may be, for example, a thin film transistor (TFT), a memory element, a capacitor etc., or, a combination of one or more of said elements to form a higher level electronic element, such as, without limitation, a sub-pixel or a pixel of the electronic device. As disclosed in the '972 application discussed above, a multi-layer circuit can be formed solely by successive depositions of materials on substrate 6 via successive deposition events in deposition vacuum vessels 4.

Each deposition vacuum vessel 4 is connected to a source of vacuum (not shown) which is operative for establishing a suitable vacuum therein in order to enable a charge of the material disposed in the corresponding deposition source 12 to be deposited on substrate 6 in a manner known in the art, e.g., sputtering or vapor phase deposition, through the one or more openings in the corresponding shadow mask 16.

Herein, substrate 6 is described as a continuous flexible sheet which is dispensed from dispensing reel 8, which is disposed in a pre-load vacuum vessel, into the deposition vacuum vessels 4. However, this is not to be construed as limiting the invention since shadow mask deposition system 2 can be configured to continuously process a plurality of standalone or individual substrates. Each deposition vacuum vessel 4 can include supports or guides that avoid the sagging of substrate 6 as it advances therethrough.

In operation of shadow mask deposition system 2, the material disposed in each deposition source 12 is deposited on the portion of substrate 6 in the corresponding deposition vacuum vessel 4 through one or more openings in the corresponding shadow mask 16 in the presence of a suitable vacuum as said portion of substrate 6 is advanced through the deposition vacuum vessel 4, whereupon plural, progressive patterns is formed on substrate 6. More specifically, substrate 6 has plural portions, each of which is positioned for a predetermined time interval in each deposition vacuum vessel 4. During this predetermined time interval, material is deposited from the corresponding deposition source 12 onto the portion of substrate 6 that is positioned in the corresponding deposition vacuum vessel 4. After this predetermined time interval, substrate 6 is step advanced so that the portion of substrate 6 is advanced to the next vacuum vessel in series for additional processing, as applicable. This step advancement continues until each portion of substrate 6 has passed through all deposition vacuum vessels 4. Thereafter, each portion of substrate 6 exiting the final deposition vacuum vessel 4 in the series is received on take-up reel 10, which is positioned in a storage vacuum vessel (not shown). Alternatively, each portion of substrate 6 exiting shadow mask deposition system 2 is separated from the remainder of substrate 6 by a cutter (not shown).

Figure 2:
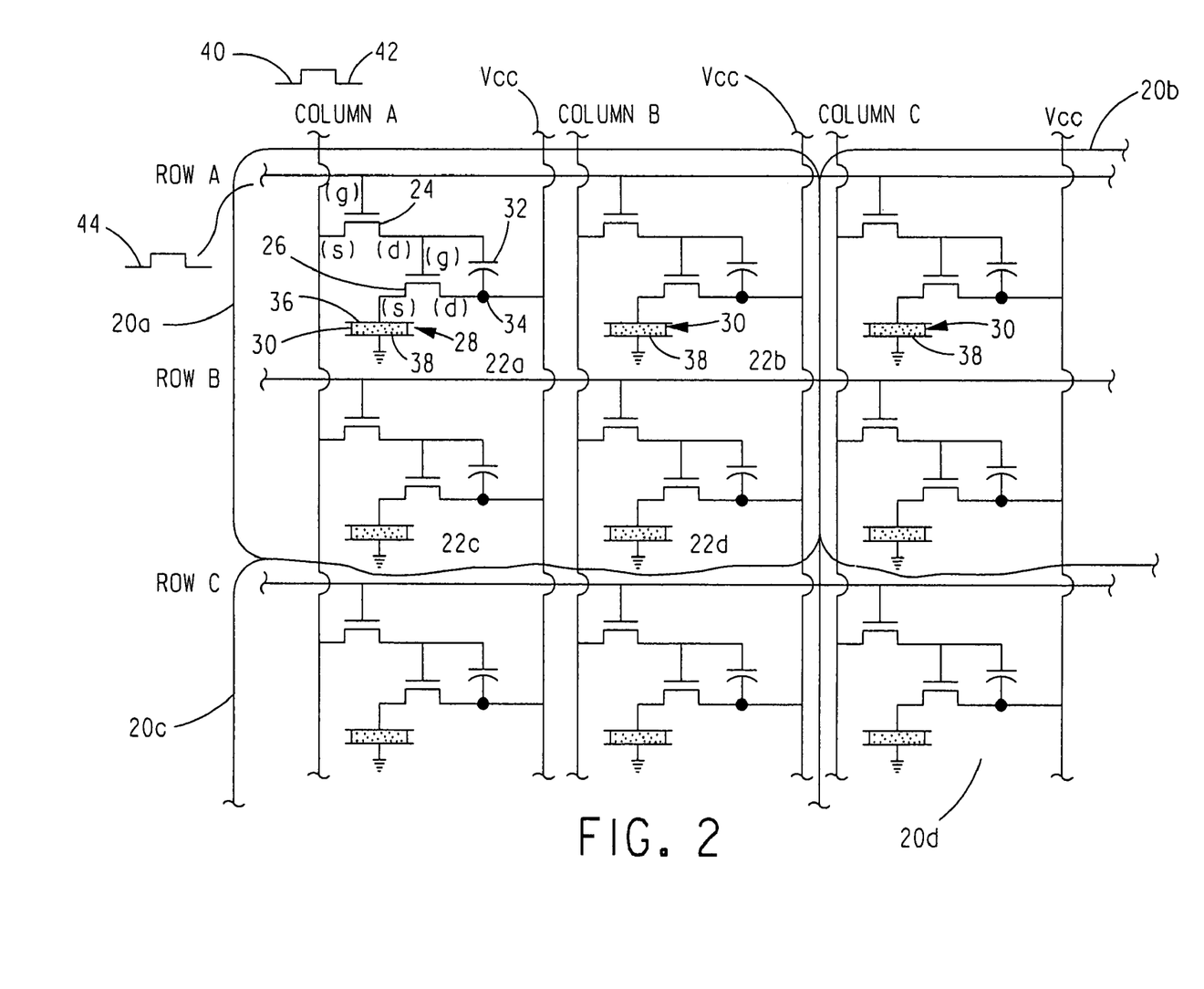
FIG. 2 is a circuit schematic of a 3×3 array of sub-pixels of an active matrix backplane wherein a 2×2 array of said 3×3 array define a pixel of said active matrix backplane.

With reference to FIG. 2, an exemplary LED pixel 20a that can be formed via shadow mask deposition system 2 comprises a 2×2 arrangement of sub-pixels 22, e.g., sub-pixels 22a-22d. Sub-pixels 22a, 22b, 22c and 22d can be a red sub-pixel, a first green sub-pixel, a second green sub-pixel and a blue sub-pixel, respectively. Alternatively, sub-pixels 22a, 22b, 22c and 22d can be a red sub-pixel, a first blue sub-pixel, a second blue sub-pixel and a green sub-pixel, respectively. Since LED pixel 20a is representative of one of several of identical pixels arranged in any user defined array configuration for forming a complete active matrix LED device, the description of LED pixel 20a, including the color of each sub-pixel 22, is not to be construed as limiting the invention. In FIG. 2, the sub-pixels of adjacent pixels 20b, 20c and 20d are shown for illustration purposes.

Sub-pixels 22a and 22b are addressed via a pulse signal applied on a Row A bus and via voltage levels applied on a Column A bus and a Column B bus, respectively. Sub-pixels 22c and 22d are addressed via a pulse signal applied on a Row B bus and via voltage levels applied on the Column A and the Column B bus, respectively. In the illustrated embodiment, each sub-pixel 22 includes cascade connected transistors 24 and 26, such as, without limitation, thin film transistors (TFTs); an LED element 28 formed of light emitting material 30 sandwiched between two electrodes; and a capacitor 32 which serves as a voltage storage element. In an exemplary, non-limiting embodiment, transistors 24 and 26, LED element 28 and capacitor 32 of each sub-pixel 22 are interconnected to each other in a manner illustrated in FIG. 2. In addition, for each sub-pixel 22, a control or gate terminal of transistor 24 is electrically connected to a suitable row bus, a node 34 formed by the connection of the drain terminal of transistor 26 to one terminal of capacitor 32 is connected to a power bus (Vcc), and the source terminal of transistor 24 is connected to a suitable column bus.

To activate each LED element 28 when a suitable voltage is applied to the corresponding power bus Vcc, the voltage applied to the corresponding column bus connected to the source terminal of transistor 24 is changed from a first voltage 40 to a second voltage 42. During application of second voltage 42, a pulse signal 44 is applied to the row bus connected to the gate terminal of transistor 24. Pulse signal 44 causes transistors 24 and 26 to conduct, whereupon, subject to the voltage drop across transistor 26, the voltage of power bus Vcc is applied to one terminal of LED element 28. Since the other terminal of LED element 28 is connected to a different potential, e.g., ground potential, the application of the voltage applied to power bus Vcc to LED element 28 causes LED element 28 to illuminate. During application of pulse signal 44, capacitor 32 charges to the difference between second voltage 42 and the voltage on power bus Vcc, minus any voltage drop across transistor 24.

Upon termination of pulse signal 44, capacitor 32 retains the voltage stored thereon and impresses this voltage on the gate terminal of transistor 26, whereupon LED element 28 is held in an active, illuminating state in the absence of pulse signal 44.

LED element 28 is turned off when pulse signal 44 is applied in the presence of first voltage 40 on the corresponding column bus. More specifically, applying pulse signal 44 to the gate terminal of transistor 24 when first voltage 40 is applied to the source terminal of transistor 24 causes transistor 24 to turn on, whereupon capacitor 32 discharges through transistor 24 thereby deactivating LED element 28. Upon termination of pulse signal 44, capacitor 34 is charged to approximately voltage 40, whereupon transistor 26 is held in its off state and LED element 28 is held in its inactive state even after pulse signal 44 is terminated.

In a like manner, each LED element 28 of each sub-pixel 22 of each pixel 20 can be turned on and off in response to the application of a pulse signal 44 on an appropriate row bus when second voltage 42 and first voltage 40, respectively, are applied to the appropriate column bus in the presence of a suitable voltage applied via the appropriate power bus Vcc.

Figure 3:
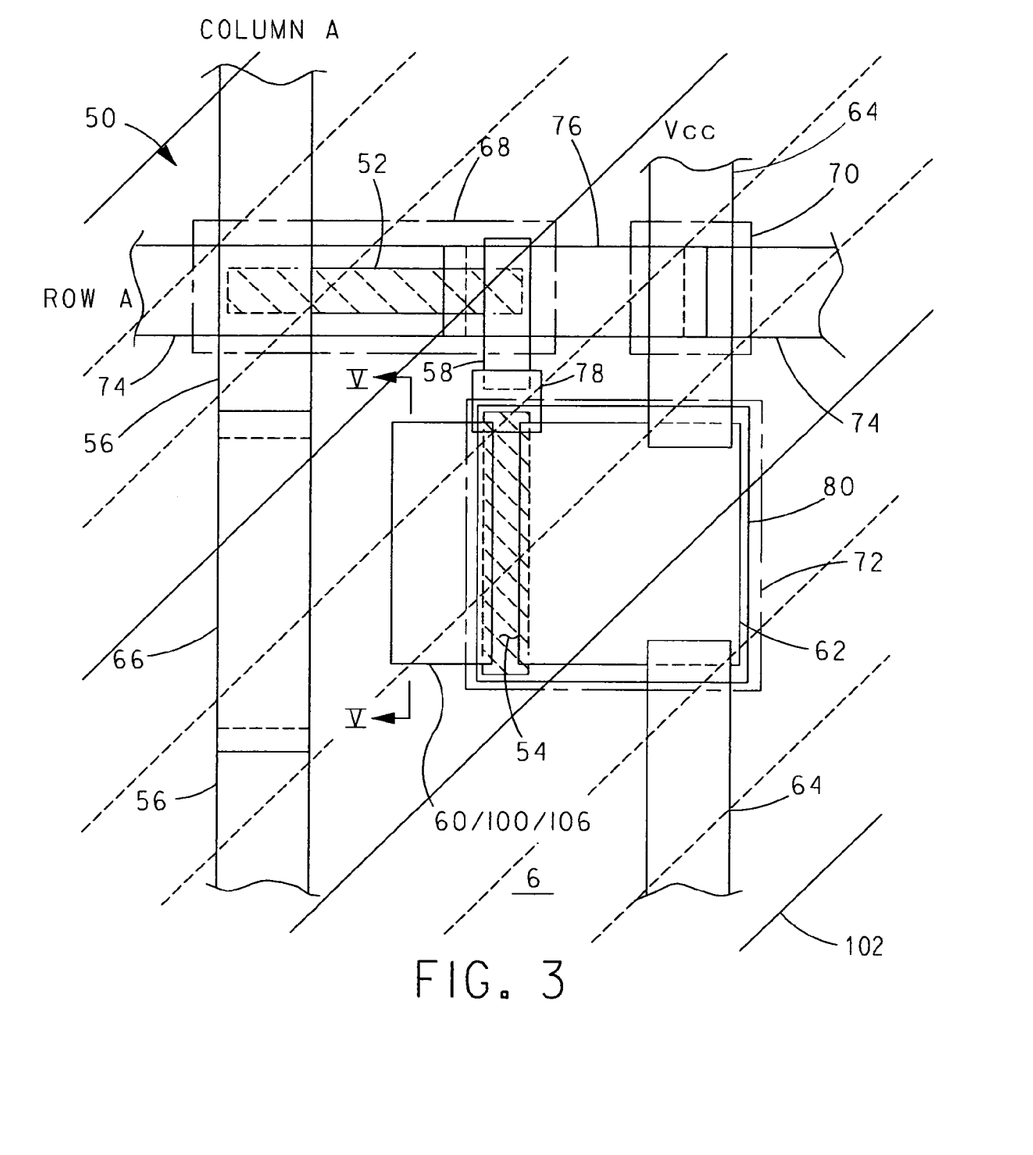
FIG. 3 is an enlarged view of an exemplary physical layout of one of the sub-pixels of FIG. 2.

With reference to FIG. 3 and with continuing reference to FIG. 2, a sub-pixel structure 50 representative of the physical structure that forms each sub-pixel 22 of each pixel 20 includes, in desired order of shadow mask vapor deposition, elongated semiconductor segment 52, elongated semiconductor segment 54, elongated metal segment(s) 56, elongated metal segment 58, elongated metal segment 60, rectangular metal segment 62, elongated metal segment(s) 64, elongated metal segment 66, elongated insulator segment 68, rectangular insulator segment 70, rectangular insulator segment 72, elongated metal segment(s) 74, elongated metal segment 76, rectangular metal segment 78 and rectangular metal segment 80.

Each metal segment 56-66 and 74-80 can be formed of any suitable electrically conductive material that is depositable via a shadow mask deposition process, such as, without limitation, molybdenum (Mo), copper (Cu), nickel (Ni), chromium (Cr), aluminum (Al), gold (Au) or indium-tin oxide (ITO). Insulator segments 68-72 can be formed of any suitable electrically nonconductive material that is depositable via a shadow mask deposition process, such as, without limitation, aluminum oxide ($Al_2O_3$) or silicon dioxide ($SiO_2$). Each semiconductor segment 52 and 54 can be formed of a semiconductor material that is depositable via a shadow mask deposition process and which is suitable for forming a thin-film transistor (TFT) by vacuum evaporation, such as, without limitation, cadmium selenide (CdSe), cadmium sulfide (CdS) or tellurium (Te).

In sub-pixel structure 50, the stack comprised of metal segment 62, insulator 72 and metal segment 80 forms capacitor 32; the combination of the segments forming capacitor 32 along with semiconductor segment 54 and metal segment 60 form transistor 26 (with metal segments 80, 60 and 62 being the respective gate, source and drain of transistor 26); and the combination of semiconductor segment 52, metal segments 56 and 58, insulator segment 68 and metal segments 74 and 76 forming transistor 24 (with metal segments 56 and 58 being the source and drain of transistor 24, and with metal segments 74 and 76 forming the gate of transistor 24).

Desirably, each sub-pixel 22 in FIG. 2 is realized by the same sub-pixel structure, such as sub-pixel structure 50. However, this is not to be construed as limiting the invention since each sub-pixel 22 can be realized by any suitable and/or desirable sub-pixel structure. Herein, however, it will be assumed hereinafter that each sub-pixel 22 is realized by sub-pixel structure 50.

In one exemplary, non-limiting, embodiment, substrate 6 is formed of an electrically insulative material, such as an insulative coated metal sheet; metal segments 60, 62 and 80 are formed from Mo, Cu, Ni, Cr, Au or Al; insulator segments 68-72 are formed from $Al_2O_3$ or $SiO_2$; metal segments 56, 58, 64, 66 and 74-78 are formed from Mo, Cu, Ni, Cr, Au or Al and semiconductor segments 52 and 54 are formed from CdSe, CdS, Te or any other suitable semiconducting material that can be deposited via a shadow mask vapor deposition process.

To complete formation of each functioning sub-pixel 22 in accordance with one embodiment, a suitable insulating material (not shown) can be deposited in a deposition vacuum vessel 4 atop of the sub-pixel structure 50 shown in FIG. 3 with an opening exposing all or a portion of metal segment 60. Another metal segment 36 (shown in FIG. 2) can then be deposited in a deposition vacuum vessel 4 atop the thus deposited insulating material in contact with metal segment 60 via the opening in the insulating material. Thereafter, light emitting material 30 can be deposited in a deposition vacuum vessel 4 atop the sub-pixel structure 50 in contact with metal segment 36 and a transparent metal segment 38 can be deposited in a deposition vacuum vessel 4 atop light emitting material 30, whereupon light emitting material 30 is sandwiched between metal segment 36 and transparent metal segment 38. Desirably, each deposit of metal segment 36, light emitting material 30 and transparent metal segment 38 is deposited atop of their corresponding sub-pixel 22 in isolation from adjacent deposits of metal segment 36, light emitting material 30 and transparent metal segment 38 atop their corresponding sub-pixels 22. Lastly, a layer or sheet of transparent metal (not shown) can be deposited in a deposition vacuum vessel 4 atop of all of the metal layers 38 and the insulating material therebetween as a common electrode for all of the sub-pixels.

Figure 4:
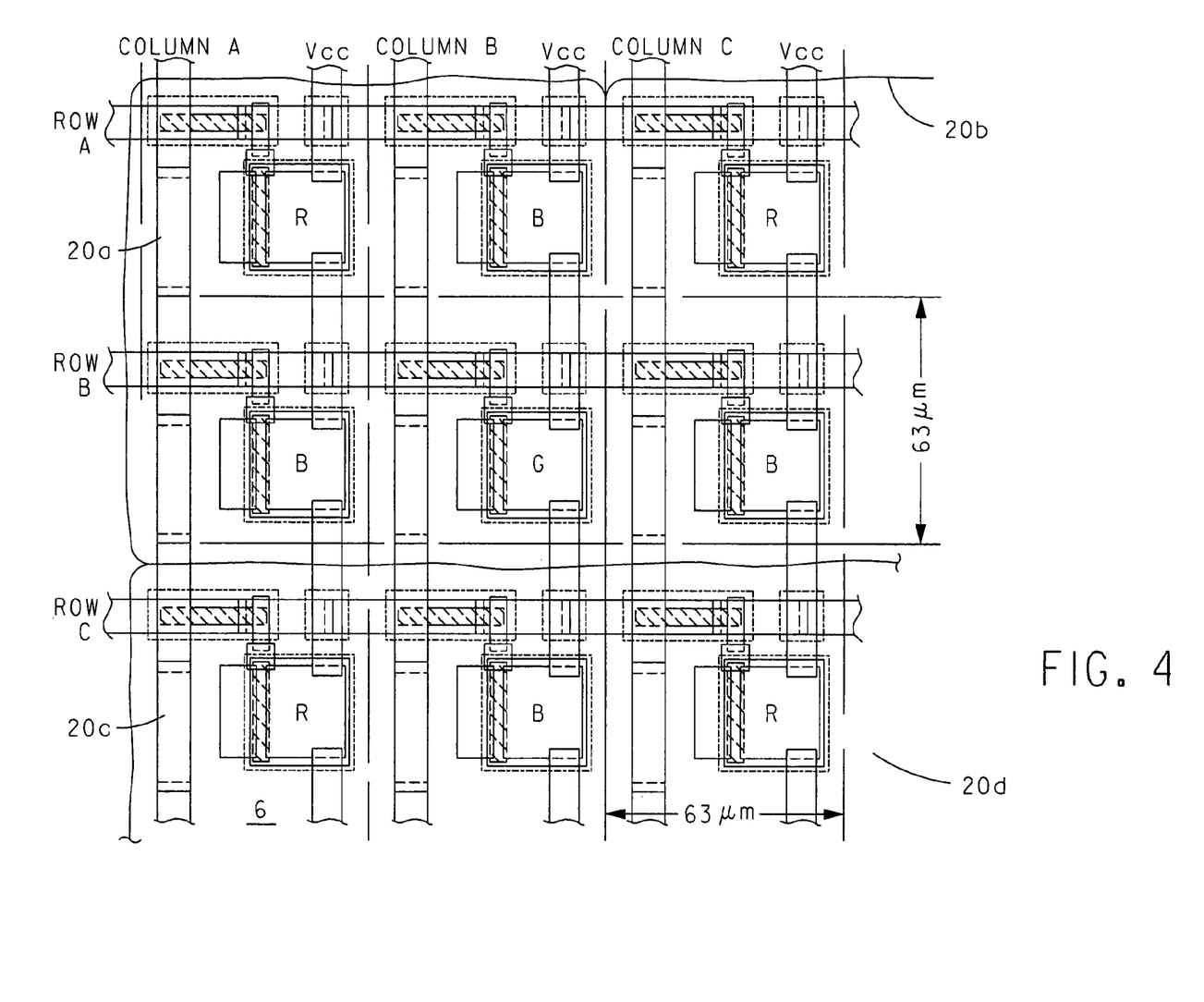
FIG. 4 is a view of an exemplary physical layout of the sub-pixel structures that form the sub-pixels of FIG. 2.

With reference to FIG. 4 and with continuing reference to FIGS. 1-3, a physical implementation of an LED pixel structure corresponding to the circuit schematic of FIG. 2 is shown upon substrate 6. In one exemplary embodiment, the overall dimensions of each pixel 20 are 126×126 microns and the overall dimensions of each sub-pixel 22 are 63×63 microns. The foregoing dimensions of each pixel 20 and each sub-pixel 22a, however, are exemplary only and are not to be construed as limiting the invention.

Figure 5:
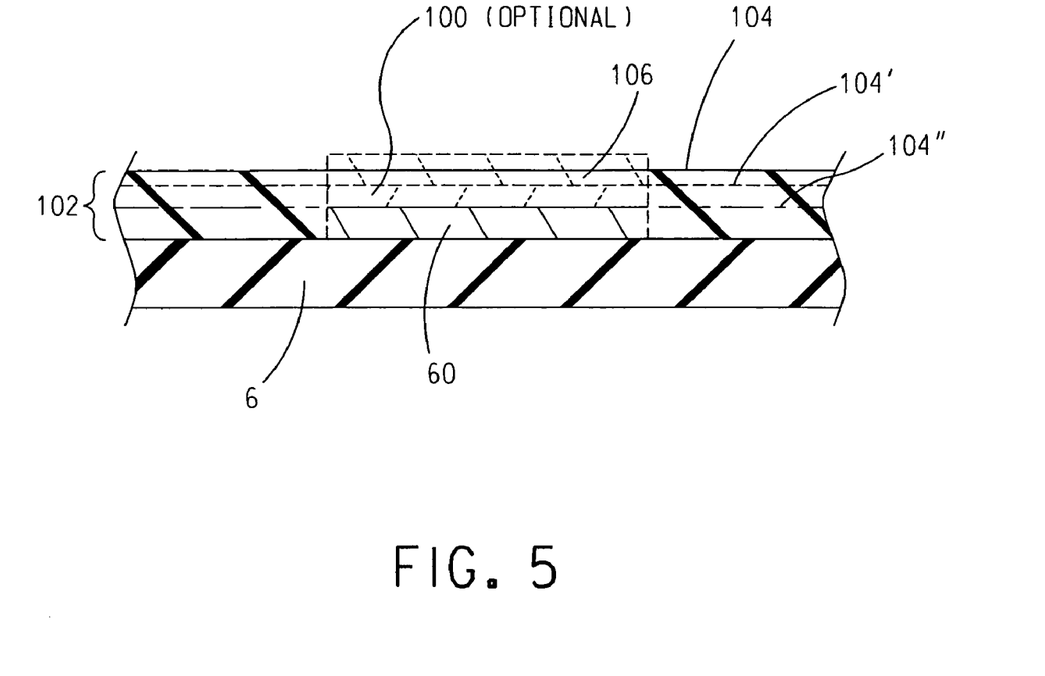
FIG. 5 is a cross section taken along lines V-V in FIG. 3.

With reference to FIG. 5 and with continuing reference to all previous figures, to complete formation of each functioning sub-pixel 22 in accordance with another embodiment, either metal segment 60 can be deposited to a height of at least one micron above the top surface of any of the other segments 52-58 and 62-80, or another, optional metal segment 100 (shown in phantom) can be provided deposited atop metal segment 60 so that the combined height of metal segments 60 and 100 is at least one micron higher than the top surface of any of the other segments 52-58 and 62-80.

A photoresist 102 can then be deposited in any suitable and/or desirable manner (e.g., without limitation, by spinning a liquid resist or by rolling a film resist) over substrate 6 covering the exposed (or uncovered) portions of segments 52-80 and, if provided, segment 100 comprising each sub-pixel structure 50 of substrate 6. Photoresist 102 can then be processed, e.g., without limitation, baked, in a manner known in the art to harden photoresist 102. When hardened, photoresist 102 protects substrate 6 and the sub-pixels 50 deposited thereon from being exposed to ambient atmosphere, especially moisture and particles in the ambient atmosphere. As shown in FIG. 5, baked photoresist 102 covers the top surface of either metal segment 60 or, if provided, metal segment 100.

Next, at a suitable time, a top surface 104 of photoresist 102 is abraded by way of any suitable and/or desirable process until either metal segment 60 or, if provided, metal segment 100 is exposed. This abrading may include abrading metal segment 60 or, if provided, metal segment 100 as the top surface of photoresist 102 is abraded. The level of the top surface of photoresist 102 after abrading is shown in phantom in FIG. 5 parallel to the top surface of metal segment 60 or, if provided, metal segment 100 by reference numbers 104" and 104', respectively. Thus, if metal segment 100 is not provided, abrading of the photoresist 102 continues until a surface of metal segment 60 is exposed. In contrast, if metal segment 100 is provided over metal segment 60, abrading of photoresist 102 continues until a surface of metal segment 100 is exposed.

Desirable ways of abrading photoresist 102 include a dry grinding process or a wet grinding (or lapping) process, the latter of which is well-known in the art of semiconductor wafer manufacturing for smoothing, polishing and planarizing the back surfaces of semiconductor wafers. Abrading (in any suitable and/or desirable manner) the side of substrate 6 that includes photoresist 102 covering circuitry, e.g., pixels 20 and sub-pixels 22, to expose metal segment 60 or, if provided, metal segment 100 is in contrast to abrading back surfaces of semiconductor wafers that do not have electrical devices formed thereon. It is believed that this is the first time that abrading in this manner is utilized in connection with the manufacture of an electronic device of the type disclosed herein.

Lastly, to complete the formation of each functioning sub-pixel 22 in accordance with this embodiment, another metal segment 106 (shown in phantom) is deposited atop the surface of each metal segment 60 or, if provided, metal segment 100 that was exposed by abrading photoresist 102. In FIG. 5, metal segment 106 is shown in contact with metal segment 100. However, if metal segment 100 is not provided, metal segment 106 will be in contact with metal segment 60. In either event, the top, exposed surface of metal segment 106 desirably extends above (higher than) the top surface 104' or 104" of photoresist 102 after abrading by at least one micron. Each metal segment 106 will thus define a post atop which light emitting material 30 can be deposited and a transparent metal segment 38 can be deposited atop light emitting material 30, whereupon light emitting material 30 is sandwiched between metal segment 106 and transparent metal segment 38. Desirably, each deposit of metal segment 106, light emitting material 30 and transparent metal segment 38 is electrically isolated from adjacent deposits of metal segment 106, light emitting material 30 and transparent metal segment 38 atop their corresponding sub-pixels 22. If desired, a layer or sheet of transparent metal (not shown) can be deposited atop of all of the metal segments 38 and the photoresist 102 surrounding each metal segment 38 as a common electrode for all of the sub-pixels.

Metal segments 100 (if provided) and 106 can be made from suitable electrically conductive material that is depositable via a shadow mask deposition process, such as, without limitation, Mo, Cu, Ni, Cr, Al, Au or ITO. Metal segments 100 (if provided) and 106 are desirably deposited in vacuum deposition vessels 4 of the type shown in FIG. 1 and described above.

If it is desired to accomplish the application of photoresist 102 to substrate 6, the baking of photoresist 102 on substrate 6 and the abrading of photoresist 102 utilizing deposition system 2 shown in FIG. 1, a photoresist deposition station 110, a baking station 112 and an abrading station 114 (all shown in FIG. 1) can optionally be included in series with the vacuum deposition vessels 4 of deposition system 2. To this end, it is envisioned that after the vacuum deposition of the latter of the last segment to be deposited to form sub-pixel structure 50 or, if provided, metal segment 100 in a vacuum deposition vessel 4, the portion of substrate 6 that received said deposit can be moved (step advanced) into photoresist deposition station 110 for the application of wet or dry (film) photoresist 102 to substrate 6 at atmospheric pressure. Thereafter, said portion of substrate 6 including photoresist 102 is moved (step advanced) into baking station 112 where photoresist 102 is hardened at atmospheric pressure, e.g., photoresist 102 is baked to a hardened state. Then, substrate 6 including hardened photoresist 102 is moved (step advanced) into abrading station 114 where hardened photoresist 102 is removed (abraded) from substrate 6 at atmospheric pressure until metal segment 60 or, if provided, metal segment 100 is exposed.

Thereafter, substrate 6 with exposed metal segment 60 or 100 is moved (step advanced) into the next vacuum deposition vessel 4 in series where metal segment 106 is deposited atop of metal segment 60 or, if provided, metal segment 100 exposed by the abrading of photoresist 102.

Alternatively, instead of being included in-line with the series collected deposition vacuum vessels 4 of deposition system 2, deposition station 110, baking station 112 and/or abrading station 114 can be apart from the series connected deposition vacuum vessels 4 of deposition system 2. Thus, for example, after vacuum depositions of segments 52-80 comprising each sub-pixel structure 50 of substrate 6 and, if provided, metal segment 100 in series connected deposition vacuum vessels 4 of deposition system 2, substrate 6 can be moved from said series connected deposition vacuum vessels 4 for processing by deposition station 110, baking station 112 and abrading station 114, which can be provided separately or connected together in any suitable and/or desirable combination or manner. For example, deposition station 110 and baking station 112 can be connected in series while abrading station 114 is provided separately; baking station 112 and abrading station 114 can be connected in series while deposition station 110 is provided separately; or deposition station 110, baking station 112 and abrading station 114 can all be provided separately. In any event, once photoresist 102 has been processed in abrading station 114, substrate 6 is moved into a vacuum deposition vessel 4 that may or may not be part of deposition system 2 or which may be connected in series with abrading station 114 for deposition of metal layer 106.

It is envisioned that any one or combination of deposition station 110, baking station 112 and/or abrading station 114 can be part of the series connected deposition vacuum vessels 4 of deposition system 2 or apart therefrom. Accordingly, nothing is to be construed from describing the connection of deposition station 110, baking station 112 and/or abrading station 114 in any manner as part of or apart from the series connected deposition vacuum vessels 4 of deposition system 2.

The invention has been described with reference to the preferred embodiments. Obvious modifications and alterations will occur to others upon reading and understanding the preceding detailed description. For example, the disclosure above of metal segment 106 being deposited atop of metal segment 60 or, if provided, metal segment 100 is not to be construed as limiting the invention since it is envisioned that any one or combination of metal segments 106, 60 and, if provided, 100 can be replaced by any one or combination of an insulator or a semiconductor material. Stated differently, segment 106 can be a conductor, an insulator or a semiconductor material; segment 80 can be a conductor, an insulator or a semiconductor material; and/or segment 100, if provided, can be a conductor, an insulator or a semiconductor material. It is intended that the invention be construed as including all such modifications and alterations insofar as they come within the scope of the appended claims or the equivalents thereof.

The invention claimed is:

1. A method of forming an electrical circuit assembly on a substrate comprising:
   (a) depositing a first metal segment on a substrate via a shadow mask vapor deposition process;
   (b) depositing a photoresist on the substrate such that the photoresist covers the first metal segment and an area surrounding the first metal segment;
   (c) causing the photoresist deposited on the substrate to harden; and
   (d) abrading the hardened photoresist until a surface of the first metal segment is exposed and a surface of the hardened photoresist is at the same level as the exposed surface of the first metal segment.

2. The method of claim 1, wherein:
   step (a) is performed in a vacuum; and
   steps (b), (c) and (d) are preformed at atmospheric pressure.

3. The method of claim 1, further including:
   (e) depositing a second metal segment on the exposed surface of the first metal segment via a shadow mask vapor deposition process.

4. The method of claim 2, wherein:
   steps (a) and (e) are performed in a vacuum; and
   steps (b), (c) and (d) are preformed at atmospheric pressure.

5. The method of claim 1, wherein step (d) is accomplished by a dry or wet grinding process.

6. A method of forming an electrical circuit assembly on a substrate comprising:
   (a) providing a substrate having thereon a plurality of first segments comprising an electrical circuit, said first segments having surfaces that rise above surfaces of other segments comprising the electrical circuit, wherein all of said segments are deposited on the substrate via one or more shadow mask vapor deposition processes in a vacuum;
   (b) causing a photoresist to cover all of the segments;
   (c) causing the photoresist deposited in step (b) to harden; and
   (d) abrading the hardened photoresist until surfaces of the first segments are exposed but surfaces of the other segments are not exposed, and a surface of the abraded photoresist is at the same level as the exposed surfaces of the first segments.

7. The method of claim 6, wherein steps (b), (c) and (d) are preformed at atmospheric pressure.

8. The method of claim 6, further including:
   (e) depositing second segments on the exposed surfaces of the first segments via a shadow mask vapor deposition process in a vacuum, whereupon the top surfaces of the second segments rise above the top surface of the abraded photoresist.

9. The method of claim 6, wherein each segment is either a conductor, an insulator or a semiconducting material.

* * * * *

UNITED STATES PATENT AND TRADEMARK OFFICE
CERTIFICATE OF CORRECTION

| | | |
|---|---|---|
| PATENT NO. | : 7,657,999 B2 | Page 1 of 1 |
| APPLICATION NO. | : 11/868640 | |
| DATED | : February 9, 2010 | |
| INVENTOR(S) | : Thomas Peter Brody | |

It is certified that error appears in the above-identified patent and that said Letters Patent is hereby corrected as shown below:

Column 9, Line 29, Claim 2, delete "preformed" and insert -- performed --

Column 10, Line 3, Claim 4, delete "preformed" and insert -- performed --

Column 10, Line 25, Claim 7, delete "preformed" and insert -- performed --

Signed and Sealed this
Tenth Day of April, 2012

David J. Kappos
*Director of the United States Patent and Trademark Office*